(12) United States Patent
Koshiba et al.

(10) Patent No.: US 9,046,763 B2
(45) Date of Patent: Jun. 2, 2015

(54) PATTERN FORMING METHOD

(75) Inventors: Takeshi Koshiba, Yokohama (JP); Ikuo Yoneda, Yokohama (JP); Tetsuro Nakasugi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 916 days.

(21) Appl. No.: 12/727,025

(22) Filed: Mar. 18, 2010

(65) Prior Publication Data

US 2010/0237045 A1 Sep. 23, 2010

(30) Foreign Application Priority Data

Mar. 19, 2009 (JP) .................. 2009-069044

(51) Int. Cl.
- B27N 3/18 (2006.01)
- G03F 7/00 (2006.01)
- B82Y 10/00 (2011.01)
- B82Y 40/00 (2011.01)

(52) U.S. Cl.
CPC ............... *G03F 7/0002* (2013.01); *B82Y 10/00* (2013.01); *B82Y 40/00* (2013.01)

(58) Field of Classification Search
USPC .......... 264/319, 492, 493, 494, 496, 241, 299
See application file for complete search history.

(56) References Cited

U.S. PATENT DOCUMENTS

| 7,282,550 B2 | 10/2007 | Xu et al. |
| 2006/0196377 A1 | 9/2006 | Loopstra et al. |
| 2007/0228593 A1 | 10/2007 | Jones et al. |
| 2009/0057267 A1* | 3/2009 | Wuister et al. ............ 216/52 |
| 2010/0012622 A1* | 1/2010 | Panga et al. .............. 216/52 |

FOREIGN PATENT DOCUMENTS

| JP | 10-315345 | 12/1998 |
| JP | 2001-068411 | 3/2001 |
| JP | 2006-352121 | * 12/2006 |
| JP | 2008-19292 | 1/2008 |
| JP | 2008-91782 | 4/2008 |

OTHER PUBLICATIONS

Notice of Reasons for Rejection Issued by the Japanese Patent Office on Jun. 7, 2011, for Japanese Patent Application No. 2009-069044 and English language translation thereof.

* cited by examiner

*Primary Examiner* — Stella Yi
(74) *Attorney, Agent, or Firm* — Finnegan, Henderson, Farabow, Garrett & Dunner, L.L.P.

(57) ABSTRACT

A pattern forming method includes determining an amount of curable resin to be formed on a substrate, the curable resin having volatility, the amount of the curable resin being determined by a calculation considering volatile loss of the curable resin, the calculation being performed for each of a plurality of regions of the substrate, forming the curable resin having the determined amount on the substrate, the forming the curable resin being performed for each of the plurality of regions of the substrate, contacting the curable resin formed on the substrate with a template, the template including a pattern to be filled with the curable resin by the contacting, and curing the curable resin under a condition where the curable resin is in contact with the template.

4 Claims, 8 Drawing Sheets

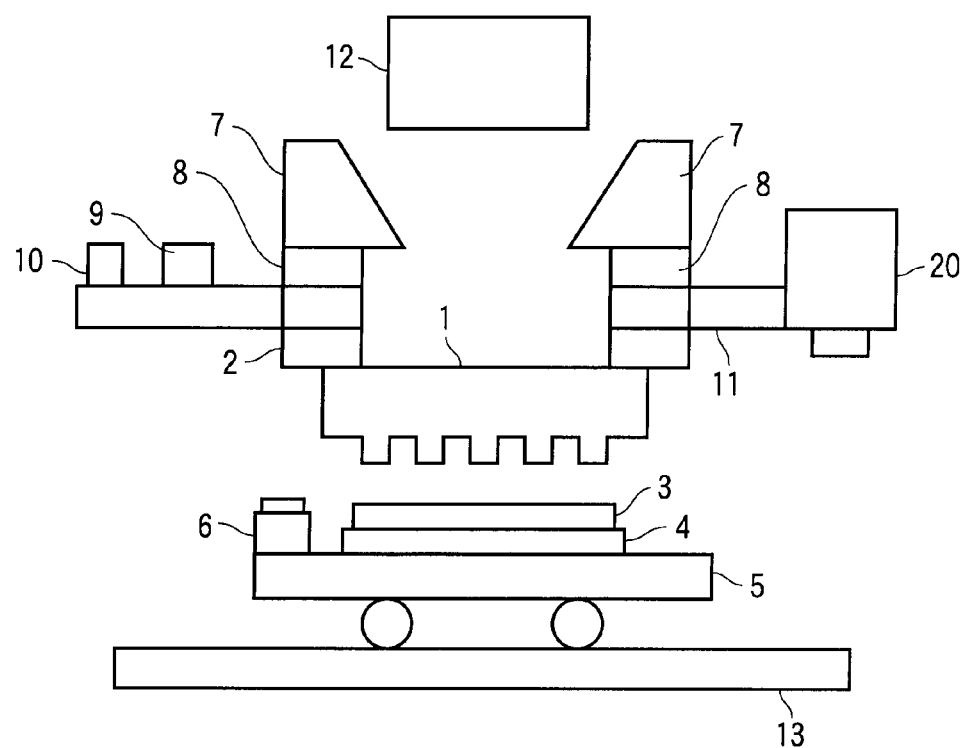
F I G. 1

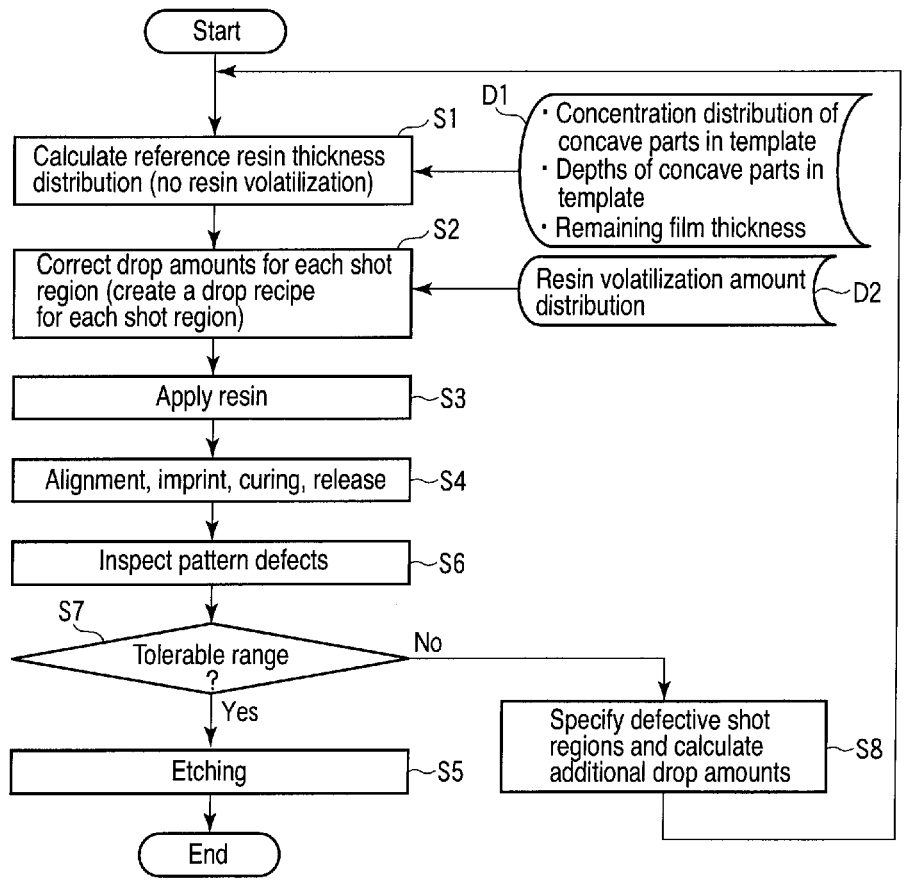
F I G. 5
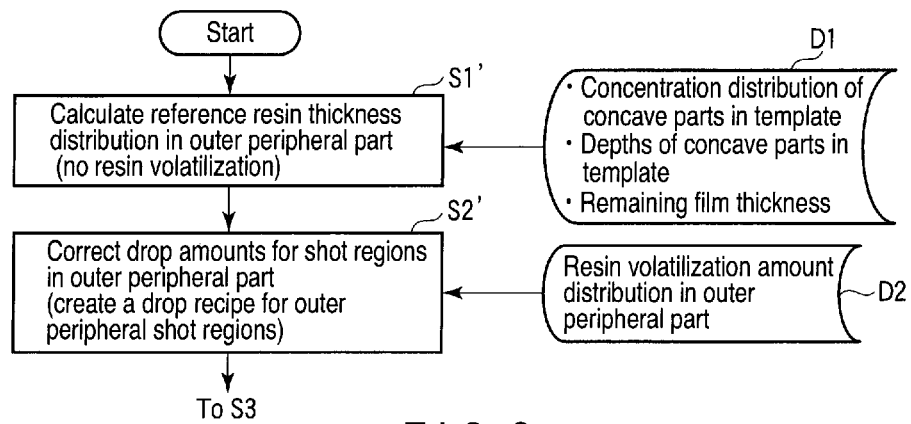
F I G. 6

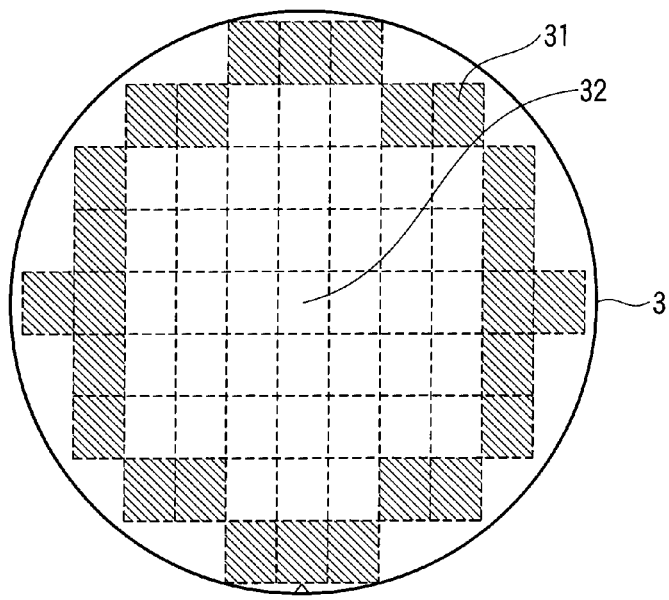
F I G. 7
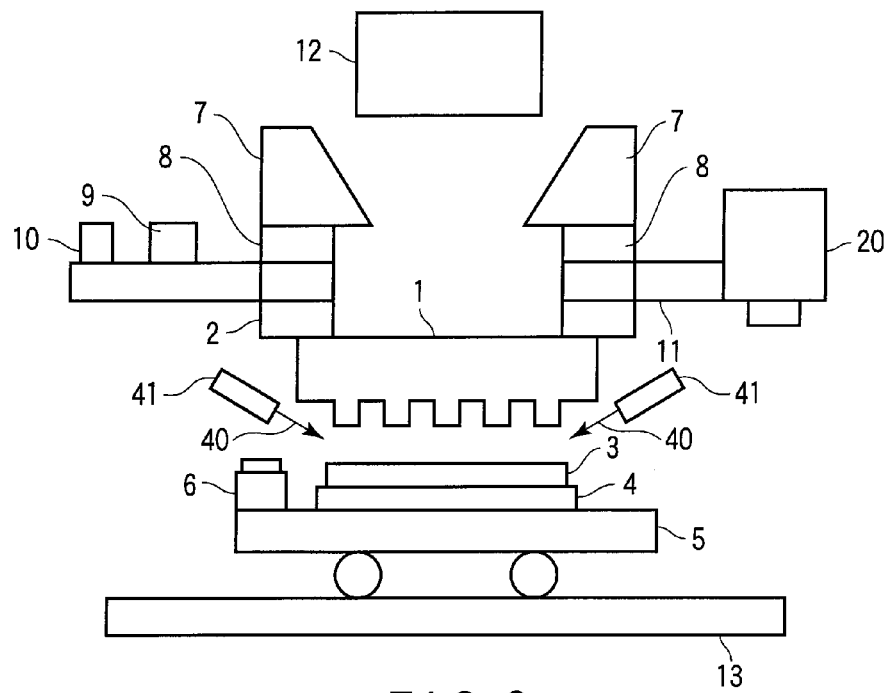
F I G. 8

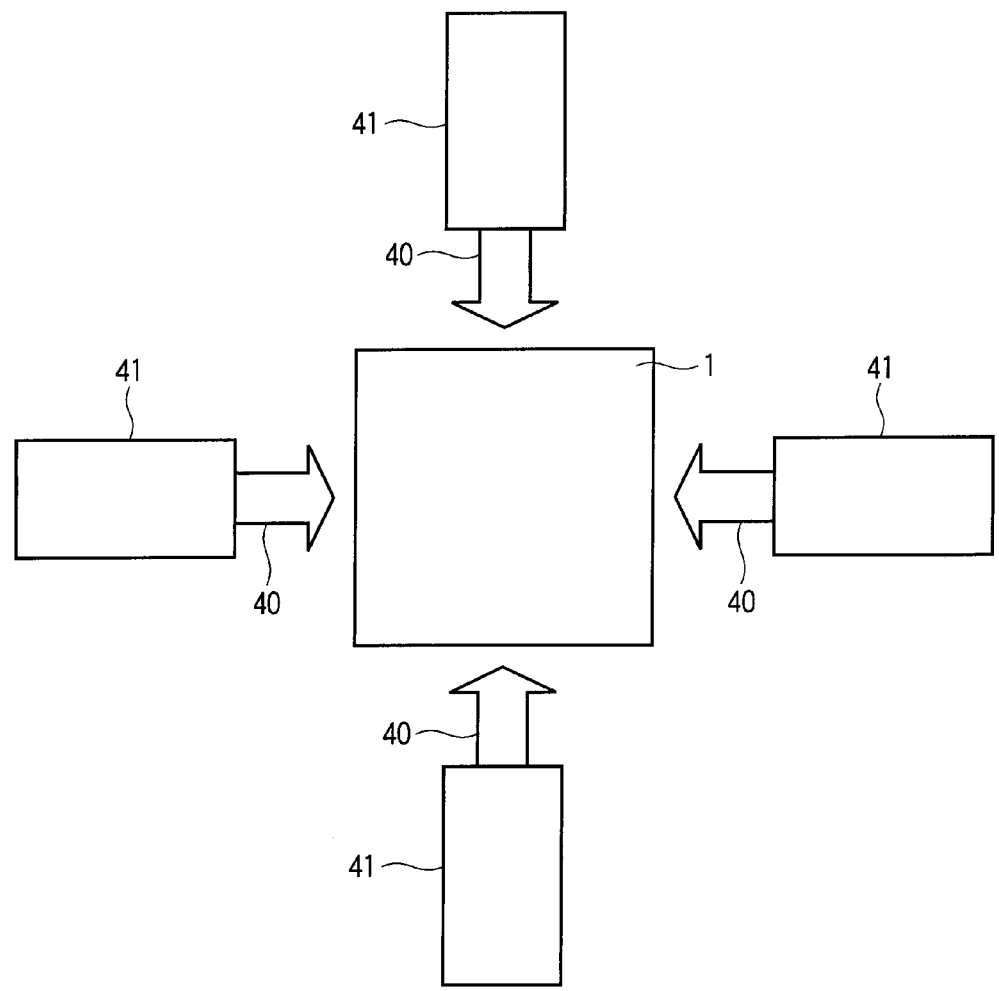
F I G. 9

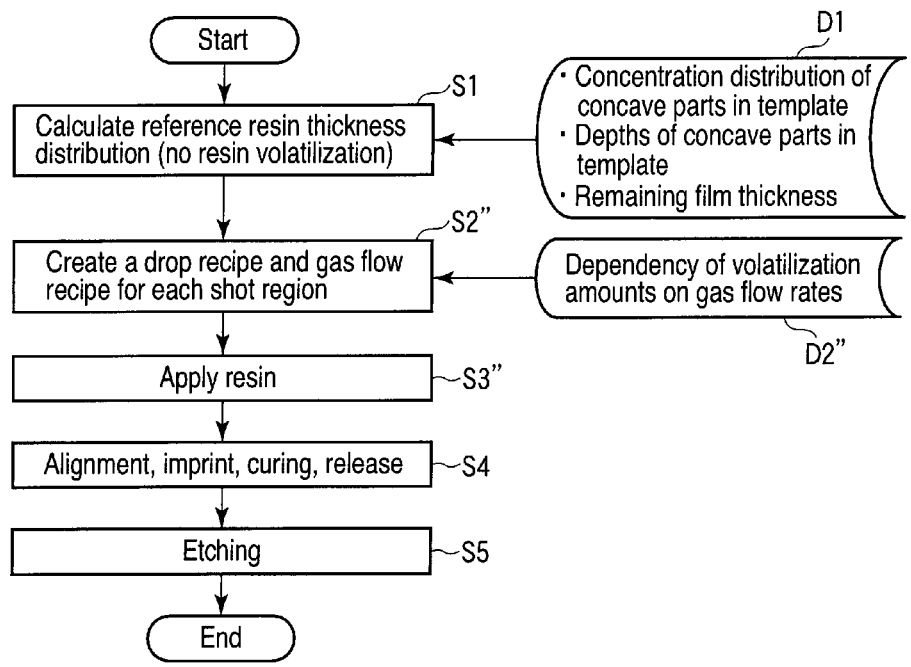
F I G. 10
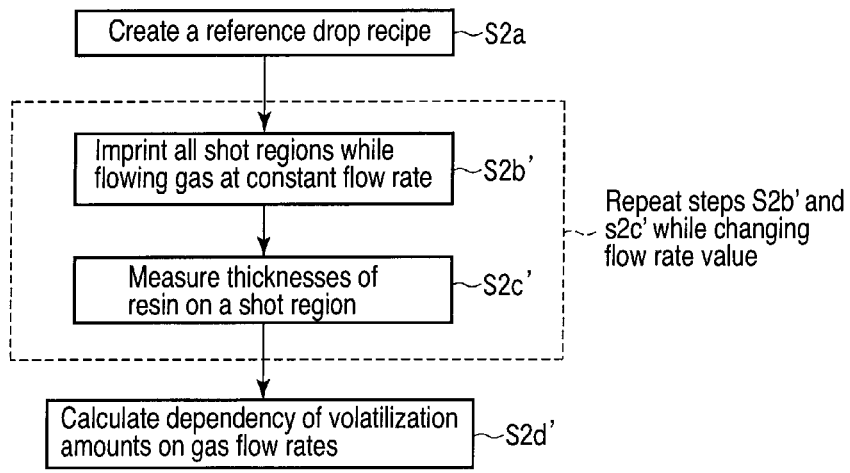
F I G. 11

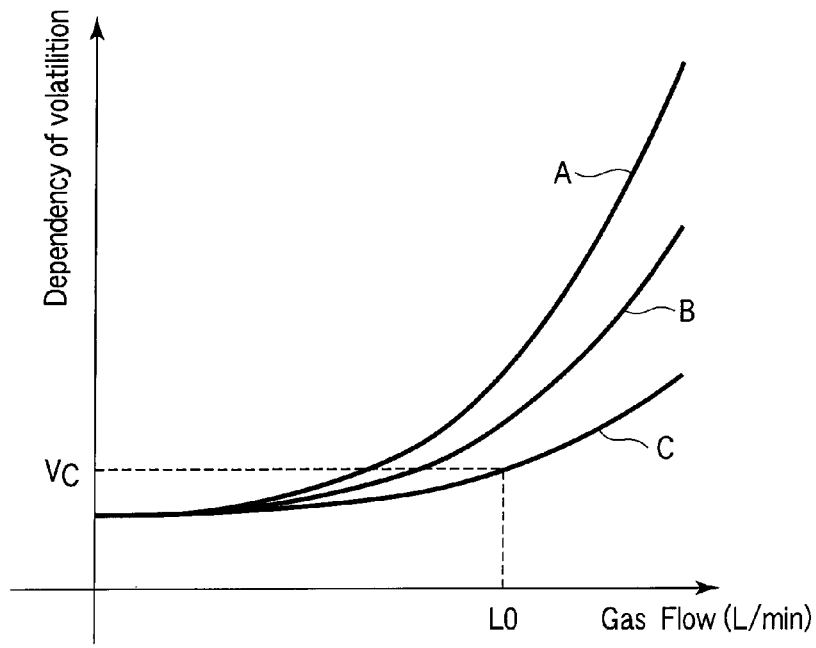
F I G. 12A
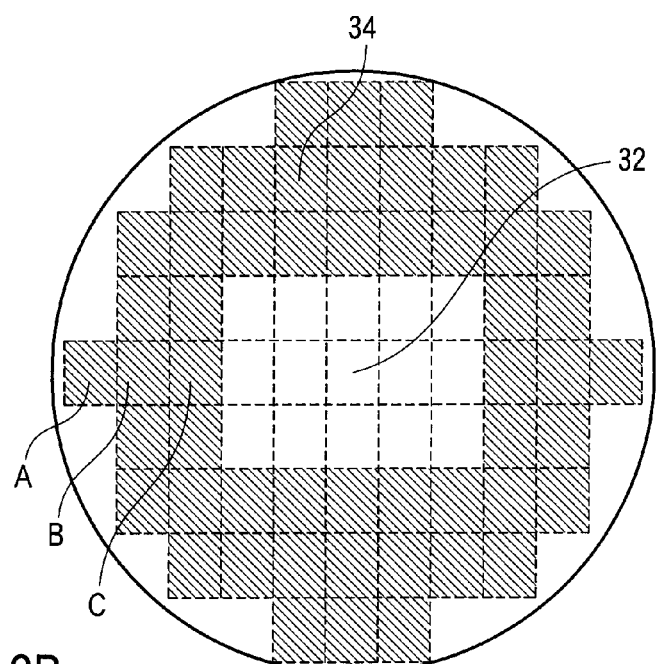
F I G. 12B

PATTERN FORMING METHOD

CROSS-REFERENCE TO RELATED APPLICATIONS

This application is based upon and claims the benefit of priority from prior Japanese Patent Application No. 2009-069044, filed Mar. 19, 2009, the entire contents of which are incorporated herein by reference.

BACKGROUND

1. Field

The present invention relates to a pattern forming method for forming a pattern on a substrate.

2. Description of Related Art

In recent years, a pattern forming method using an optical imprint method has been attracting attention (Jpn. Pat. Appln. KOKAI Publication No. 2001-68411). The optical imprint method includes a step of applying light curable resin onto a substrate, a step (alignment) of positioning the substrate and a template (also called a mold or an original plate), a step (imprint) of contacting the light curable resin with the template, a step of curing the light curable resin by irradiation of light, a step (demold) of separating the template from the cured light curable resin (resin pattern), and a step of etching the substrate using the resin pattern as a masked.

The following method is one of optical imprint methods expected to be most applicable on semiconductor lithography.

In this method, at first, liquid light curable resin is discharged toward (applied onto) a substrate by inkjet method, to form liquid light curable resin on one-shot of area (shot area) of the substrate. The discharge amount (drop amount) of the liquid light curable resin is calculated in consideration of a density of pattern (concave portion of a concave/convex pattern) formed on the template, and the like. contacted with the template. Thereafter, the template is more closed to the substrate. This condition is maintained for a constant time period such that the liquid light curable resin spreads into the concave portion of the concave/convex pattern of the template, and when the constant time is passed, light (UV) is irradiated on the liquid light curable resin to cure the liquid light curable resin. Thereafter, the template is separated from the cured light curable resin.

However, the conventional method described above has a problem as follows. After the liquid light curable resin is formed on the substrate, volatilization of the light curable resin proceeds until the liquid light curable resin is cured, which results in thinning of the light curable resin.

Therefore, even if the light curable resin is discharged (applied) on the substrate in accordance with a distribution quantity of the drop amount of the light curable resin which is calculated in consideration of the density of pattern (concave portions of the concave/convex pattern) formed on the template, the concave portions of the concave/convex pattern, a portion not filled with the light curable resin arises in the concave portions of the concave/convex pattern. The portion not filled with the light curable resin causes a pattern defect (unfilled defect) depending on size and shape of the portion not filled with the light curable resin.

BRIEF SUMMARY

According to an aspect of the present invention, there is provided a pattern forming method comprising: determining an amount of curable resin to be formed on a substrate, the curable resin having volatility, the amount of the curable resin being determined by a calculation considering volatile loss of the curable resin, the calculation being performed for each of a plurality of regions of the substrate; forming the curable resin having the determined amount on the substrate, the forming the curable resin being performed for each of the plurality of regions of the substrate; contacting the curable resin formed on the substrate with a template, the template comprising a pattern to be filled with the curable resin by the contacting; and curing the curable resin under a condition where the curable resin is in contact with the template.

According to another aspect of the present invention, there is provided a pattern forming method comprising: determining an amount of curable resin to be formed on a substrate, the curable resin having volatility; forming curable resin having the determined amount on the substrate; contacting the curable resin with a template while providing gas over the curable resin, the template comprising a pattern to be filled with the curable resin by the contacting, the gas over a center portion of the substrate and the gas over an outer portion of the substrate being in a different gas condition to uniform the volatile loss of curable resin on the substrate; and curing the curable resin under a condition where the curable resin is in contact with the template.

According to another aspect of the present invention, there is provided a pattern forming method comprising: determining an amount of curable resin to be formed on a substrate, the curable resin having volatility, the amount of the curable resin being determined by a calculation wherein the calculation is performed such that an amount of the curable resin to be formed on an outer portion of the substrate is determined larger than an amount of the curable resin to be formed on a center portion of the substrate.

BRIEF DESCRIPTION OF THE SEVERAL VIEWS OF THE DRAWING

FIG. 1 is a diagram schematically representing a pattern forming apparatus according to embodiments;

FIG. 5 is a flowchart representing a pattern forming method according to a second embodiment of the invention;

FIG. 6 is a flowchart for explaining a pattern forming method according to a third embodiment;

FIG. 7 is a plan view for explaining the pattern forming method according to the third embodiment;

FIG. 8 is a diagram schematically representing a pattern forming apparatus according to a fourth embodiment;

FIG. 9 is a plan view for explaining a layout of gas flow nozzles of a pattern forming apparatus according to the fourth embodiment;

FIG. 10 is also a plan view for explaining a layout of gas flow nozzles according to the fourth embodiment;

FIG. 11 is a flowchart for explaining an example of a method for creating dependency of volatilization amount on gas flow rate; and FIGS. 12A and 12B are diagrams for explaining dependency of volatilization amount on gas flow rate in different positions of shot region.

DETAILED DESCRIPTION

Figure 2:
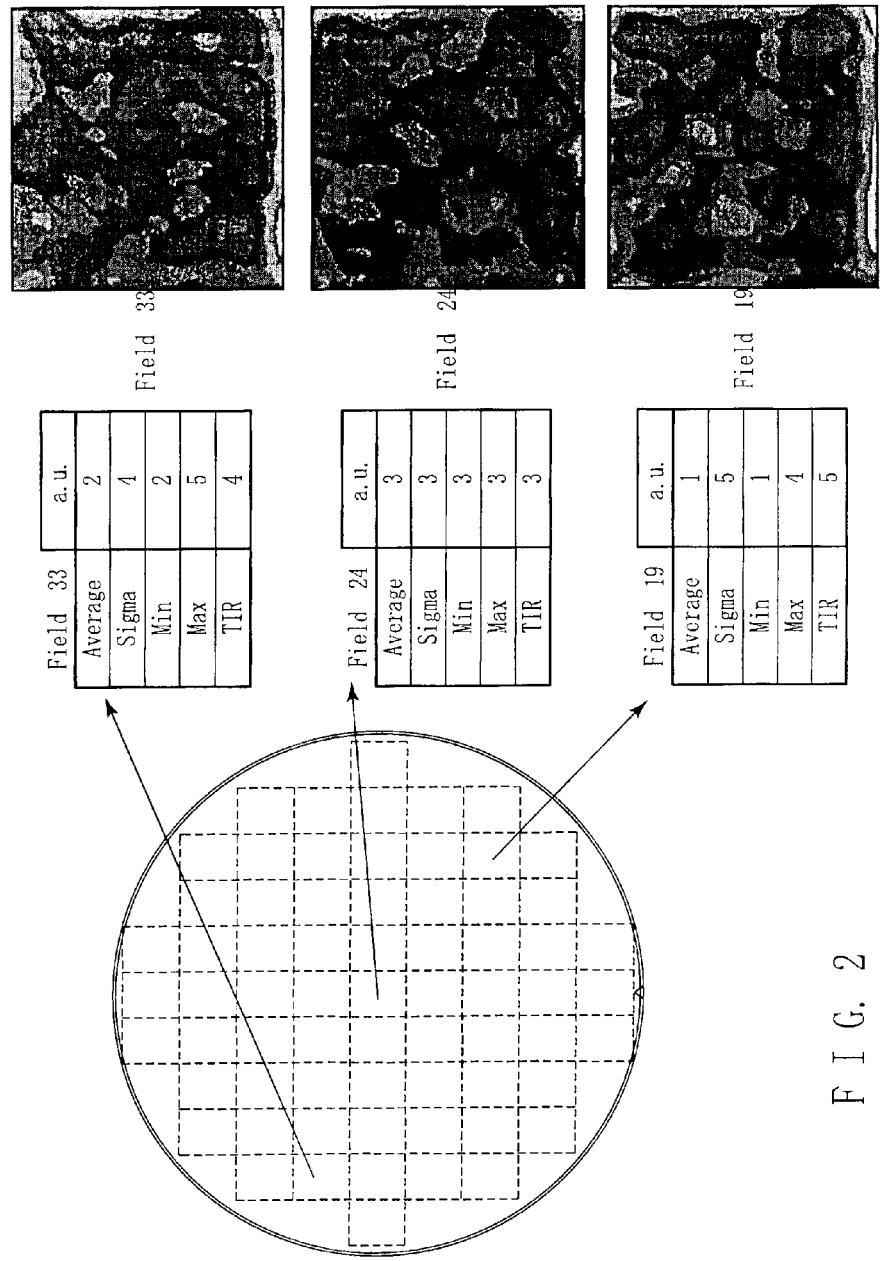
FIG. 2 represents film thickness distribution of light curable resin using a blank template.

Embodiments will be explained below with reference to the accompanying drawing.

First Embodiment

FIG. 1 schematically represents a pattern forming apparatus used in the present embodiment.

In FIG. 1, 1 denotes a template including a pattern formed of concave and convex (transfer pattern) The template 1 can be held on an original stage 2.

Here, the material of template 1 is such as quartz or fluorite, which allows ultraviolet rays to pass through. The transfer pattern includes a pattern corresponding to a device pattern and a pattern corresponding to an alignment inspection mark used at the time of misalignment inspection. The original plate stage 2 can be moved so that the template 1 is positioned at the apparatus reference position.

A substrate 3 on which the transfer pattern is to be transferred is held on a chuck 4. The substrate 3 is, for example, a silicon substrate (semiconductor substrate) or an SOI substrate (semiconductor substrate). The substrate 3 may have a multilayer structure. For example, the substrate 3 may be constituted by a semiconductor substrate and an electrically conductive or insulating film provided on the semiconductor substrate (substrate of multilayer structure). The conductive film is, for example, a metal film or a polycrystalline silicon film to be processed into a gate material. The insulating film is, for example, a silicon nitride film, or a silicon oxide film to be processed into a hard mask.

By using the pattern forming apparatus of the embodiment, a pattern using light curing resin as a material (resin pattern) is formed on the substrate 3. A fine pattern is formed on the substrate by etching the substrate 3 using the resin pattern as mask.

The chuck 4 is configured to be fixed on a sample stage 5. It is desirable that the sample stage 5 can be moved along three mutually orthogonal axes X, Y and Z and rotated about each of the three axes. The sample stage 5 is placed on a stage bench 13.

A reference mark stand 6 is fixed on the sample stage 5. A reference mark (not shown) serving as the reference position of apparatus is placed on the reference mark stand 6. Here, the reference mark comprises a diffraction grating. The reference mark is used for calibrating the alignment sensors and positioning the template 1 (attitude control and adjustment).

A first alignment mark (original plate alignment mark) not shown is formed on the template 1. A second alignment mark (underlying alignment mark) is formed on an underlying pattern which is previously formed on the substrate 3. The underlying alignment mark and the original plate alignment marks are used to measure a relative positional displacement between the template 1 and the substrate 3. Here, the original plate alignment marks and the underlying alignment mark comprise diffraction gratings.

A positional displacement of the template 1 with respect to the reference mark and a positional displacement of the substrate 3 with respect to the original plate are measured by the alignment sensors 7 (first measurement unit). The alignment sensors 7 are fixed on the alignment stage 8.

The positional displacement of the template 1 with respect to the reference mark is detected by moving the sample stage 5 using a moving mechanism not shown to a location where the reference mark and the template 1 can be detected simultaneously, then irradiating the reference mark and the original plate alignment mark with light from a light source not shown and measuring the position of center of gravity of light diffracted and reflected back to the alignment sensors 7.

On the other hand, a positional displacement of the substrate 3 with respect to the template 1 (the relative positional displacement between the original plate and the substrate) is obtained by moving the sample stage 5 using the moving mechanism not shown to a location where the opposed original plate alignment mark and the underlying alignment mark can be detected simultaneously, then irradiating light from the light source onto the original plate alignment mark and the underlying alignment mark and measuring the position of center of gravity of light diffracted and reflected back to the alignment sensors 7.

A correction mechanism 9 (correction unit) has an adjustment mechanism for fine adjustment of the position (attitude) of the template 1, the adjustment mechanism corrects the relative position between the template 1 and the substrate 3 by fine adjustment of the position of the template 1.

When the pattern of the template 1 is transferred onto the substrate 3, the template 1 disposed above the substrate 3 is pressed down on the substrate 3 by means of a pressure application unit 10 (pressing unit) in a state that the relative position between the template 1 and the substrate 3 is corrected by the correction mechanism 9. Thereby, the pattern transferring with high accuracy is made to be possible.

In spite of the fact that only two alignment sensors 7 (right and left ones) are shown in FIG. 1, it is preferable that the number of the alignment sensors is four or more.

A UV light source 12 is fixed on the base body (not shown). Ultraviolet rays emitted from the UV light source 12 are irradiated onto the light curing resin applied on the substrate 3 through the template 1. In spite of the fact that the UV light source 12 is disposed just above the template 1 in FIG. 1, the disposition of the UV light source 12 is not limited to the above mentioned place.

The pattern forming apparatus of the present embodiment further comprises a misalignment inspection mechanism 20 (second measuring unit). The misalignment inspection mechanism 20 is attached to a base 11 of the apparatus. The misalignment inspection mechanism 20 is adapted to measure a relative positional displacement between the alignment inspection mark previously formed on the underlying pattern of the substrate 3 and the alignment inspection mark of the template 1 transferred onto the light curing resin applied on the substrate 3. The misalignment inspection mechanism 20 is made of a conventional optical inspection one by way of example.

In general, the application amount of light curable resin of imprinting is calculated based on a density of pattern to be transferred per unit area and depth of concave on the template, and a thickness (remaining film thickness) of light curable resin thinly remained between convex portions of the template and the substrate (in a gap) at the time of imprinting.

In case of a conventional imprint apparatus, air in a gap between a substrate applied with resist and a template is substituted with a substitute gas when performing imprinting. Therefore, the conventional imprint apparatus is configured so as to spray the substitute gas toward the substrate from a gas nozzle set around the substrate.

Here, the substitute gas is, for example, a gas having a small molecular amount such as a $CO_2$ gas, or an inert gas such as a $N_2$ gas. Light curable resin for imprinting is a material having high volatility, and therefore, volatilization amounts (volatile loss) of the light curable resin need to be corrected when creating a drop recipe.

Further, in case of patterning with use of the conventional imprint apparatus, the distribution of volatilization amounts of the light curable resin which is caused by spraying the substitute gas is generated within one shot region. Therefore, application amounts of the light curable resin need to be corrected by measuring the distribution of volatilization amounts of the light curable resin in advance in the shot region.

Distribution of the volatilization amounts of the light curable resin (volatile loss distribution of the curable resin) within the shot region is obtained by performing process from a step of applying the light curable resin up to a release step of releasing the template 1 with use of a template (mold) which is called a blank template (blank mold), and by further measuring distribution of thicknesses of the light curable resin after the releasing step.

The foregoing blank template is a template on which no pattern is formed at all although this template has the same shot size as a template on which a desired pattern is formed. The blank template provides, for example, a merit of easy manufacture because pattern forming is not required, and another merit of easy discovery and correction of a defect. There is still another merit that inplane volatilization amount distribution which is independent from patterns can be obtained because no pattern exists.

In place of the blank template, a template including a pattern corresponding to a pattern to be actually formed on the substrate may be used. By using such a template, more accurate correction can be achieved.

By adding a correction value to distribution of volatilization amounts of the light curable resin in the shot region, effective distribution of application amounts of light curable resin with which a desired pattern can be obtained with high accuracy can be calculated.

Here, the foregoing phrase that "a desired pattern can be obtained with high accuracy" means that there is no unfilled defect and uniformity of the remaining film thickness of the light curable resin is high. Obtained distribution of application amounts of the light curable resin is converted into a drop recipe for dropping the light curable resin as drops, and is then used for an imprint process.

The correction of volatilization amounts in case of using the foregoing blank template is as follows. Distribution of volatilization amounts caused by spraying the substitute gas within a shot region of the light curable resin is measured, and a measurement result thereof (variants of volatilization amounts within one shot region) is reflected on the drop recipe concerning all shot regions on a substrate.

Here, as shown in FIG. 2, in general, a result of measuring distribution of film thicknesses of the light curable resin with use of the blank template shows a tendency of differing in the plane of the substrate (within the all shot regions). Values of respective parameters (Average, Sigma, Min, Max, and TIR) in FIG. 2 express a relationship in relative size where a value of a field 24 (center field) is set to 3. Parameter values increase in an order of 1, 2, . . . , 5. A contour map in FIG. 2 represents film thickness distribution of the light curable resin in one shot in steps of 5-nm, and all film thicknesses distribution differs among a shot (field 24) near the wafer center and shots in the periphery of the wafer. That is, FIG. 2 represents an experimental result indicating that volatilization amount distribution differs for each shot region.

The above experimental result suggests that different volatilization amount corrections for the light curable resin are required for individual shot regions, respectively. The present inventors supposes this suggestion to be a phenomenon caused from a reason that differences among substitute gas flows generated above the substrate appear locally, in particular, between vicinity of the center and periphery of the substrate, owing to the device configuration of spraying the substitute gas from around templates.

The present embodiment employs a method in which distribution of thicknesses of light curable resin is measured in advance with use of a blank template for each shot region, to perform imprinting by applying a proper drop recipe for each shot region. By employing this method, the present embodiment aims to effectively suppress generation of pattern defects such as unfilled defects by sufficiently reducing in-plane variants of amounts of the light curable resin on a substrate. In place of all shot regions, at least two shot regions may be sufficient. In case of only two shot regions, a shot region in a peripheral portion may be selected as one of the two shot regions, and a shot region in a center portion may be selected as the other of the two shot regions.

In addition, even volatilization amounts which do not cause pattern defects such as unfilled defects differ depending on the positions of shot regions. Accordingly, the height of a formed pattern varies depending on positions on the pattern. Such variants of height (reduction in flatness) are factors which cause reduction of a process margin. In case of forming a pattern having a multi-layer structure by layering patterns, the upper the level where a pattern is layered is, the greater the influence of the reduction in flatness is.

Meanwhile, U.S. Pat. No. 7,282,550 Publication discloses a method for reducing volatile components by adjusting volatility of a resin material to be low. In actual, however, improvements in materials are so difficult in some aspects and have not yet reached a practical level.

Figure 3:
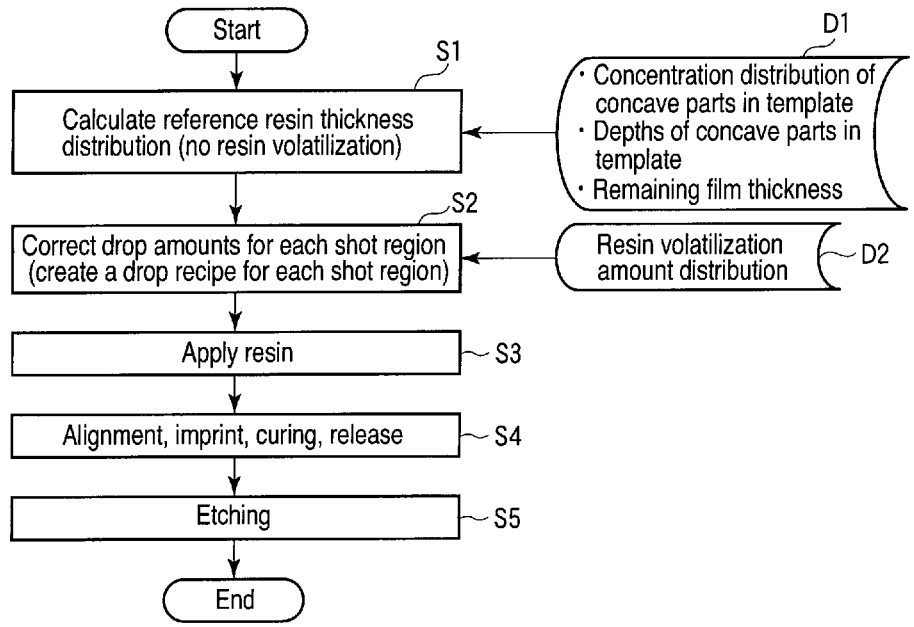
FIG. 3 is a flowchart for explaining a pattern forming method according to a first embodiment.

FIG. 3 is a flowchart for explaining a pattern forming method according to the present embodiment.

[Step S1]

Distribution of thicknesses of liquid light curable resin (hereinafter referred to as reference resin thickness distribution (initial amount of curable resin)) is calculated supposing that the light curable resin is not volatile. This calculation is made in the same manner as in prior art. Specifically, drop amounts of the light curable resin which are required to fill concave portions of a concave/convex pattern formed on a template are calculated on the basis of data D1 concerning concentration distribution of concave portions of the concave/convex pattern formed on the template, and depths of the concave portions (concave depths of the template). The reference resin thickness distribution can be calculated by adding, to the calculated drop amounts, drop amounts corresponding to remaining film thicknesses (data D1) of the light curable resin during imprint. The concentration distribution and depths of the concave portions are calculated by using design data (for example, GDS data) of the template.

[Step S2]

From the foregoing experimental result, volatilization amounts of the light curable resin are considered to respectively differ among positions (shot positions) in in-plane shot regions of the substrate. Therefore, the drop amount of the light curable resin need to be corrected for each shot region.

Hence, in the present embodiment, prepared distribution D2 (hereinafter resin volatilization amount distribution) of volatilization amounts of light curable resin for each shot region on the substrate is used to correct the reference resin thickness distribution calculated in the step S1, thereby to create a drop recipe for each shot region.

Figure 4:
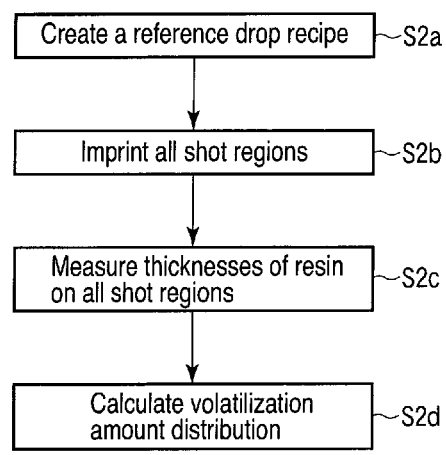
FIG. 4 is a flowchart for explaining an example of a method for creating resin volatilization amount distribution.

FIG. 4 is a flowchart for explaining an example of a creation method for creating the resin volatilization amount distribution D2.

[Step S2a]

There is prepared a blank template on which no pattern is formed at all although the blank template has the same shot size as a template on which a desired pattern is formed. Using the blank template, a drop condition (or a reference drop recipe) for light curable resin is created so that thickness of the light curable resin dropped in the shot regions is made uniform under the drop condition when dropping (or applying) liquid light curable resin onto shot regions in accordance with an inkjet method using this blank template. The light curable resin dropped in the shot regions may have a thickness which allows the film thickness to be measured, e.g., about 20 to 50 nm.

[Step S2b]

As has been described above, volatization amounts of liquid light curable resin are considered to differ depending on in-plane shot positions on the substrate. Therefore, volatilization amount distribution is obtained for each shot region.

Using the reference drop recipe and the blank template, imprinting is performed on the entire surface (all shot regions) of the substrate. At this time, a waiting time for filling in imprinting for each shot region is set to be sufficiently long, to prevent defect from occurring due to insufficient filling of light curable resin (unfilled defect). This is because there is a risk that unfilled defect may adversely influence film thickness measurement.

[Step S2c]

After completion of imprinting on the entire surface of the substrate, thicknesses of the light curable resin are measured at plural positions (measurement positions Pi where I=1, 2, . . . , n) in a shot region by using a film thickness measurement device. By performing such measurement on remaining shot regions, thicknesses of the light curable resin at plural positions (measurement positions) in each shot region (measurement resin distribution) are obtained.

For example, an optical film thickness measurement device which performs measurement by using interference of a laser is used as the film thickness measurement device. Any other film thickness measurement device than this optical one may also be used.

[Step S2d]

The resin volatilization amount distribution D2 is calculated on the basis of a measurement result as described above. A calculation method for calculating the resin volatilization amount distribution D2 may be one of two methods (1) and (2) below.

(1) For each of plural measurement positions Pi in a shot region, a difference $\Delta i$ (=Di−Dref) between a measured film thickness Di and a predetermined reference film thickness Dref is calculated. A difference $\Delta i$ at a measurement position Pi is defined as a resin volatilization amount at the measurement position. Resin volatilization amounts at the other positions than the measurement positions Pi (I=1, 2, . . . , n) are calculated by interpolation. In this manner, resin volatilization distribution in one shot region is calculated. Resin volatilization amount distribution D2 over the entire shot regions is obtained by calculating resin volatilization amount distribution for each of the other shot regions, in the same manner as above.

(2) A maximum value among plural measured film thicknesses Di (I=1, 2, . . . , n) in one shot region is taken as a reference film thickness Dref'. That is, thicknesses of light curable resin in a shot region which has consumed least volatilization amounts are taken as the reference film thicknesses Dref'. For each of plural measurement positions Pi in a shot region, a difference $\Delta Di$ (=Dref'−Di) between a measured film thickness Di and a reference film thickness Dref' is calculated. A difference $\Delta Di$ at a measurement position Pi is defined as a resin volatilization amount at the measurement position. Resin volatilization amounts at the other positions than the measurement positions Pi (I=1, 2, . . . , n) are calculated by interpolation. In this manner, resin volatilization distribution in one shot region is calculated. Resin volatilization amount distribution D2 over the entire shot regions is obtained by calculating resin volatilization amounts in each of the other shot regions, in the same manner as above.

Next, steps S3 and S4 subsequent to the step S2 will now be described below. The series of steps S3 and S4 are performed for each shot region.

[Step S3]

Based on the drop recipe created in the step S2, light curable resin is dropped onto one shot region on the substrate.

[Step S4]

After the step S3, known alignment step, imprint step, curing step, releasing step, and other step are performed.

The known alignment step, imprint step, curing step, releasing step, and other step will now be described in brief below.

In the alignment step, the substrate and the template are positioned. The template is constituted by a transparent substrate having a surface where a pattern (concave pattern) is formed. The transparent substrate is, for example, a quartz substrate. The concave pattern corresponds to a pattern to be formed on the substrate.

In the imprint step, the template is brought into direct contact with the light curable resin. At this time, the light curable resin remains thin (in gaps) between convex portions of the template and the substrate. The remaining thin light curable resin forms a remaining film.

In the curing step, the light curable resin is cured by irradiating light on the light curable resin.

In the releasing step, the template is released from the light curable resin.

The aforementioned other step is, for example, inspection step for checking defects in a pattern after the releasing step.

The steps S3 and S4 described above are performed on each of the remaining shot regions.

[Step S5]

After the step S4, known etching step and known other step are carried out to form a pattern on the substrate.

The aforementioned etching step and other step will now be described in brief.

In the etching step, for example, the remaining film is removed by anisotropic etching based mainly on an oxygen plasma, thereby forming a pattern (resin pattern) made of the cured light curable resin, and further, the substrate is etched by using the pattern as an etching mask. In this manner, a micro pattern is formed on the substrate.

The aforementioned step is, for example, removal step for removing the etching mask (resin pattern), and is performed in the etching step.

Thereafter, patterns in upper layers are formed if necessary. Upon completion of pattern forming for one substrate, the processing procedure goes to a sequence of executing pattern forming on remaining substrates in the same method as described above.

Thus, according to the present embodiment, occurrence of unfilled defects due to volatilization of light curable resin applied onto a substrate can be effectively suppressed by performing imprinting with use of a drop recipe which takes into consideration proper volatilization amount distribution for each shot region. Even if such unfilled defects do not occur, occurrence of unfilled defects due to in-plane variants of volatilization amounts can be effectively suppressed by filling light curable resin in concave portions of a concave/convex pattern on a template. Further, in case of volatilization amounts which do not cause pattern defects such as unfilled defects, decrease of a process margin due to variants of height (i.e., deterioration of flatness) can be effectively suppressed.

In the present embodiment, a correction is made to volatilization amounts with reference to reference resin thickness distribution. A further correction may be additionally made to prevent occurrence of unfilled defects due to three-dimensional gaps in an underlying layer. For example, a small pattern (namely, a concave/convex pattern of a template which has small concave portions) can be filled in a shorter time than a large pattern (namely, a concave/convex pattern of a template which has large concave portions). Therefore, considering that such a large pattern easily causes unfilled defects in imprint process for which a filling time period is decided regardless of patterns, greater drop amounts are set for a large pattern while smaller drop amounts are set for a small pattern adjacent to the large pattern.

Second Embodiment

FIG. 5 is a flowchart representing a pattern forming method according to the second embodiment. In the following figures, portions common to portions in figures which have already referred to are denoted at common reference symbols, and detailed descriptions thereof will be omitted herefrom.

[Steps S1 to S4]
Steps S1 to S4 are performed in the same manner as in the first embodiment.

[Step S6]
A defect inspection is performed on the pattern formed on the substrate.

Specifically, a pattern defect inspection is performed with use of an optical defect inspection device in accordance with a die-to-die scheme or a cell-array scheme, to detect defects specific to imprinting.

At this time, defects caused by other factors including particle dust than the imprint process. However, principally, unfilled defects called "Non-Fill" specific to imprinting are detected/extracted in this embodiment.

Unfilled defects in imprinting frequently occur as common defects when there are local spots where light curable resin is insufficient or when a filling time is short. In a process wafer, there are originally undesired concave/convex portions formed in underlying layer processing (such as processed concave/convex portions caused by the underlying layer processing). Unfilled defects occur in a wafer plane with a particular tendency in some cases.

From any reasons, unfilled defects frequently become large-scale defects or large-size defects. Therefore, unfilled defects can be distinguished from other faults (or defects). For example, unfilled defects can be distinguished by SEM-Review.

Here, as an example, detection of defects specific to imprinting by using an optical defect inspection device. The present embodiment is not limited to this example but may use a defect inspection device according to an EB method.

[Step S7]
Whether a detection result (defects) obtained by the defect inspection in the Step S6 is within a tolerable range or not is determined.

In this step, Yes is determined if there is not a defect specific to imprinting or, more specifically, an unfilled defect among detected defects. Otherwise, if there is even only one or more unfilled defects, No is determined. Criterion for the determination is not limited hitherto.

If Yes is a result of the determination in the step S6, the process goes to the step S5. As in the first embodiment, patterns in upper layers are formed if necessary.

[Step S8]
Otherwise, if No is a result of the determination in the step S7, the process goes to the step S8. That is, in the step S8, shot regions (defective shot regions) where unfilled defects exist are specified, and amounts of shorts of (drop amounts to be added) light curable resin which are required to fill concave portions are calculated, on the basis of position coordinates and sizes of the unfilled defects and depths of concave portions of the template.

Thereafter, the reference film thickness distribution calculated in the step S1 is corrected on the basis of correction information (concerning the defective shot regions and drop amounts to be added) obtained in the step S8. In this embodiment, the corrected reference film thickness distribution is raised by the drop amounts to be added, compared with the reference film thickness distribution before correction.

The step 2 (of creating a new drop recipe) is performed with use of the corrected reference resin thicknesses distribution. The step S3 (of applying light curable resin) is performed with use of the created new drop recipe. Further, a pattern is formed by performing the step S4.

The step S3 (of applying light curable resin) to be performed with use of a created new drop recipe is performed after removing light curable resin applied in the step S3 performed with use of a drop recipe created before correction, or is performed on a new substrate having the same underlying layer as in the step S3 performed with use of a drop recipe before correction.

After performing the steps S2 to S4 with use of corrected reference resin thickness distribution, the process may be terminated without performing the step S6 (of defect inspection) or the step S6 may be performed again. By performing the step S6 at this time on only portions which have been determined to be defective shot regions, an inspection time can be shortened. As for the step S6, the steps S8, S1 to S4, and S6 may be repeated until Yes is obtained in the step S7 (determination), or pattern forming may be stopped if Yes is not obtained in the step S7 (determination) even after repetitions for a predetermined number of times.

According to the present embodiment, defects specific to imprinting can be more reduced by adding the steps S6 to S8 (rework of reforming a resin pattern by feeding back a result of a defect inspection). Accordingly, highly accurate pattern transfer can be achieved.

Also in the present embodiment, a correction based on volatilization amounts is made to reference resin thicknesses distribution as in the first embodiment. A further correction may be added to prevent occurrence of unfilled defects due to three-dimensional gaps in an underlying layer.

Third Embodiment

FIG. 6 is a flowchart for explaining a pattern forming method according to the third embodiment.

The present embodiment differs from the first and second embodiments in that reference resin thickness distribution is obtained for not all but a portion of shot regions on a substrate.

In the present embodiment, reference resin thickness distribution is obtained for regions of the substrate except the center portion thereof, e.g., plural shot regions 31 in outer peripheral portions of the substrate 3 (step S1'), as represented in FIG. 7.

Here, the reason why the center portion of the substrate is thus excluded is based on experiential knowledge discovered by the present inventors, i.e., variants of volatilization amounts are not observed in the center portion in many cases.

In addition, the correction to drop amounts is made to the reference resin thickness distribution obtained in the step S1' (step S2'). This correction is made by using prepared distribution (outer-peripheral resin volatilization amount distribution) D2' of volatilization amounts of light curable resin in plural shot regions in outer peripheral portions. A method for creating the outer-peripheral resin volatilization amount distribution D2' is the same as the method for creating resin volatilization amount distribution D2 except that targets are plural shot regions in outer peripheral portions.

After the step S2', the plural shot regions 31 in the outer peripheral portions are subjected to step from the step S3, as in the first and second embodiments.

On the other side, for remaining plural shot regions excluding the aforementioned plural shot regions 31 in the outer peripheral portions from all shot regions of the substrate 3, resin volatilization amount distribution in a shot region 32 in the center of the substrate 3 is obtained. The obtained resin volatilization amount distribution is used in common to the remaining plural shot regions, and remaining steps are performed as in the prior art.

According to the present embodiment, reference resin thickness distribution need only be obtained for not all but a portion of shot regions on a substrate, and therefore, throughput is improved. In particular, effect of improving the throughput by shortening a time required for film thickness measurement is great.

Fourth Embodiment

In the first to third embodiments, in-plane volatilization amount distribution on a substrate (on all shot regions) is obtained thereby to correct a drop recipe. In this manner, variants of amounts of light curable resin in the plane of the substrate are sufficiently reduced.

However, if a tendency of in-plane volatilization amount distribution on the substrate has been known in advance, in-plane variants of amounts of light curable resin on the substrate can be sufficiently reduced by flowing a gas so as to make the volatilization amount distribution uniform, without correcting a drop recipe. Hereinafter, a description will be made of a pattern forming apparatus and a pattern forming method on the basis of such knowledge.

FIG. 8 schematically represents a pattern forming apparatus according to the present embodiment. The pattern forming apparatus according to the present embodiment differs from the pattern forming apparatus represented in FIG. 1 in that a gas supply mechanism for flowing a gas 40 onto a substrate 3.

The gas supply mechanism comprises gas flow nozzles 41. Although FIG. 8 represents only two gas flow nozzles 41, gas flow nozzles 41 are respectively provided for four edges of a template in the present embodiment as represented in a plan view of FIG. 9.

Gases 40 are supplied so as to flow respectively in four directions toward the center of the template 1. In this manner, air in concave portions of a concave/convex pattern of the template 1 can be substituted with the gas 40 immediately before imprinting operation.

Each of the gas flow nozzles 41 is provided with an unillustrated precision regulator, so that flow rates of the gasses 40 are controllable. The precision regulator forms portion of the gas supply mechanism. Flow directions of the gases are controlled by known measures and methods.

Alternatively, the number of gas flow nozzles 41 is not limited but may alternatively be one, two, three, five, or more.

FIG. 10 is a flowchart for explaining a pattern forming method according to the present embodiment.

[Step S1]
Reference resin distribution is obtained in the same manner as in the first embodiment (FIG. 3).

[Step S2"]
A drop recipe is created in the same manner as in the step S2 in FIG. 1. Further, a gas flow recipe which is not created in the step S1 in FIG. 1 is crated. The gas flow recipe will be described in more details below.

As has been described above, volatilization amounts of the light curable resin respectively differ depending on positions of shot regions. Therefore in the present embodiment, a gas flow recipe is created for each shot region by using prepared dependency D2" of a volatilization amount of the light curable resin on the gas flow rate for each shot region on the substrate, in order that volatilization amounts of the light curable resin are uniform on the entire surface (all shot regions) of the substrate.

FIG. 11 is a flowchart for explaining an example of a method for creating the dependency 2" of the volatilization amount on the gas flow rate.

[Step S2a]
A reference drop recipe is created in the same manner as in the first embodiment (FIG. 4).

[Step S2b']
Imprinting is performed on the entire surface (all shot regions) of the substrate while flowing a gas at a constant flow rate onto the substrate by using a reference drop recipe and a blank template.

[Step S2c']
After completion of the imprinting, thickness of the light curable resin is measured at a representative point in a shot region. The representative point is, for example, the center of the shot region.

The present inventors have confirmed that among shot regions A, B, and C as represented in FIGS. 12A and 12B, the dependency of the volatilization amount on the gas flow rate is highest in the shot region A, is second highest in the shot region B, and is lowest in the shot region C.

That is, confirmation has been made on a tendency that the closer to the most outer periphery of the substrate a shot region is, the higher the dependency of the volatilization amount on the gas flow rate is.

In addition, the dependency of the volatilization amount on the gas flow rate in the shot region C has been substantially the same as the dependency of the volatilization amount on the gas flow rate in the shot region 32 at the center of the substrate 3.

Accordingly, in the case of FIGS. 12A and 12B, measurement is performed on a shot region 34 hatched with oblique lines (a shot region in the outer peripheral side) and on a shot region 32 at the center of the substrate 3. However, measurement is not performed on the other shot regions (which intervene between the shot regions 34 and 32). A measurement result on the shot region 32 is taken as a thickness of the aforementioned other regions. A time required for measurement can be shortened thereby, and throughput can be improved accordingly. That is, measurement need to be performed only on at least two or more shot regions. However, thickness measurement may be performed on all shot regions, aiming for accuracy.

The steps 2b' and 2c' are repeatedly performed while changing values of the flow rates. The flow rates can be controlled by, for example, the precision regulator.

[Step S2d']
Based on results obtained by repeatedly performing the steps S2b' and S2c', thickness distribution of the light curable resin which has caused volatilization after application step is obtained for each of plural flow rates. For each of other flow rates than the aforementioned plural flow rates, thickness distribution of the light curable resin which has caused volatilization after the application step is obtained by interpolation. From the thickness distribution of the light curable resin which has caused volatilization, dependency of the thickness of the light curable resin on the gas flow rate is obtained for each shot region on the substrate. FIG. 12A as has been described previously represents an example of the dependency of thickness of the light curable resin on the gas flow rate for each shot region (shot regions A to C) on the substrate.

With reference to FIG. 12A, a next description will be made of a specific example of a method for creating a gas flow recipe for each shot region, using the dependency of thickness of the light curable resin on the gas flow rate for each shot region on the substrate.

As described previously, the dependency of the volatilization amount on the gas flow rate for the shot region C has been substantially the same as the dependency of the volatilization amount on the gas flow rate for the shot region 32 at the center of the substrate 3.

Hence, the gas flow rate is controlled so that the dependency of the volatilization amount on the gas flow rate in plural shot regions 34 becomes closer to the dependency of the volatilization amount on the gas flow rate in the shot region C. This control of the gas flow rate is performed by using one or two or more of the four gas flow nozzles 41 represented in FIG. 9.

Specifically, setting (the recipe) of the gas flow rate is determined so that, at a gas flow rate=L0, each of volatilization amounts in the plural shot regions 34 becomes closer to a volatilization amount Vc at the shot region C, i.e., variants of volatilization amounts are not higher than a constant value. For example, setting (recipe) of the gas flow rate is determined so that, at the gas flow rate=L0, absolute values of differences between volatilization amounts in the shot regions 34 and a volatilization amount in the shot region C are 5 nm or less where converted into thickness of the light curable resin.

In addition, in the above example, setting (recipe) of the gas flow rate is determined so that variants of volatilization amounts are not higher than a constant value at one single gas flow rate=L0. In order to improve accuracy, however, the setting (recipe) of the gas flow rate may be determined so that variants of volatilization amounts are not higher than a constant value at plural gas flow rates.

Further, in place of controlling gas flow rates, gas flow directions may be controlled or both of gas flow rates and gas flow directions may be controlled so that variants of volatilization amounts are not higher than a constant value.

[Step S3"]

Based on the drop recipe and the gas flow recipe which have been created in the Step S2", light curable resin is dropped on the shot regions.

[Steps S4 and S5]

As in the first embodiment, known alignment step, imprint step, curing step, releasing step, and other step (S4), and known etching step and other step (S5) are performed.

In the present embodiment, rework of reforming a resin pattern by feeding back a result of a defect inspection may be performed as in the second embodiment.

Thus, according to the present embodiment, in-plane variants of amounts of the light curable resin on the substrate can be sufficiently reduced by changing at least either gas flow rates or gas flow directions of gases which are let flow on the light curable resin. As a result, occurrence of pattern defects can be suppressed when forming a pattern on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
   determining an amount of curable resin to be formed on a substrate, the curable resin having volatility;
   forming curable resin having the determined amount on the substrate;
   contacting the curable resin with a template while providing gas over the curable resin by using a gas supply mechanism, the template comprising a pattern to be filled with the curable resin by the contacting, wherein the gas over a center portion of the substrate and the gas over an outer portion of the substrate are set in a different gas condition by using the gas supply mechanism, the gas condition being determined in response to a volatilization amount for each of the center portion and the outer portion of the substrate to uniform the volatile loss of curable resin on the substrate; and
   curing the curable resin under a condition where the curable resin is in contact with the template,
   wherein the gas condition includes at least one of flow rate of the gas and flow direction of the gas.

2. The pattern forming method according to claim 1, further comprising: separating the template from the cured curable resin to form a first pattern in the cured curable resin; and forming a second pattern on the substrate based on the first pattern.

3. The pattern forming method according to claim 2, wherein the forming the second pattern on the substrate based on the first pattern comprises etching the substrate by using the first pattern as a mask.

4. The pattern forming method according to claim 1, wherein the curing the curable resin comprises irradiating the curable resin with light.

* * * * *